(12) United States Patent
Kugel et al.

(10) Patent No.: US 9,704,567 B1
(45) Date of Patent: Jul. 11, 2017

(54) STRESSING AND TESTING SEMICONDUCTOR MEMORY CELLS

(71) Applicant: International Business Machines Corporation, Armonk, NY (US)

(72) Inventors: Michael B. Kugel, Boeblingen (DE); Stefan Payer, Stuttgart (DE); Wolfgang Penth, Holzgerlingen (DE); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/207,531

(22) Filed: Jul. 12, 2016

(51) Int. Cl.
| G11C 29/00 | (2006.01) |
| G11C 11/419 | (2006.01) |
| G11C 11/418 | (2006.01) |

(52) U.S. Cl.
CPC .......... *G11C 11/419* (2013.01); *G11C 11/418* (2013.01)

(58) Field of Classification Search
USPC ........................................ 365/201, 154, 203
See application file for complete search history.

(56) References Cited

U.S. PATENT DOCUMENTS

| 5,424,988 | A * | 6/1995 | McClure ................ G11C 29/50 365/201 |
| 6,643,804 | B1 | 11/2003 | Aipperspach et al. |
| 7,133,320 | B2 | 11/2006 | Adams et al. |
| 7,805,645 | B2 | 9/2010 | Frey et al. |
| 8,064,279 | B2 | 11/2011 | Houston et al. |
| 8,379,467 | B2 | 2/2013 | Deng et al. |
| 8,593,890 | B2 | 11/2013 | Adams et al. |
| 9,064,071 | B2 | 6/2015 | Bansal et al. |
| 9,542,996 | B2 | 1/2017 | Thomas et al. |
| 9,558,805 | B2 | 1/2017 | Kang et al. |
| 2010/0142300 | A1* | 6/2010 | Chen ...................... G11C 29/50 365/201 |
| 2012/0075918 | A1 | 3/2012 | Arsovski et al. |
| 2013/0058177 | A1 | 3/2013 | Seshadri et al. |
| 2016/0055921 | A1 | 2/2016 | Jungmann et al. |
| 2016/0196871 | A1 | 7/2016 | Liaw |

(Continued)

OTHER PUBLICATIONS

Mamy Randriamihaja et al., "Assessing Intrinsic and Extrinsic End-of-Life Risk Using Functional SRAM Wafer Level Testing", ResaerchGate, Article • Apr. 2015, 5 pages, © 2015 IEEE.

(Continued)

*Primary Examiner* — Vu Le
(74) *Attorney, Agent, or Firm* — Nicholas D. Bowman

(57) ABSTRACT

A memory cell that is readable through a bit line and addressable through a word line can be stressed using a method that includes addressing the memory cell, through the word line, for an addressing time. The memory cell can be stressed by applying a stress voltage to the bit line for a stress voltage time that overlaps with the addressing time for a stress time Δt. A method for testing a memory cell can include writing a data value into the memory cell, stressing the memory cell, reading a stored value from the memory cell and determining whether the stored value corresponds to the data value. A testable memory array can include at least one memory cell that is addressable through a word line and readable through a bit line and a stress circuit for applying a stress voltage to the bit line.

17 Claims, 4 Drawing Sheets

(56) References Cited

U.S. PATENT DOCUMENTS

2017/0047113 A1     2/2017    Kim et al.
2017/0053696 A1     2/2017    Jeong et al.

OTHER PUBLICATIONS

Ney et al., "A New Design-for-Test Technique for SRAM Core-Cell Stability Faults", Automation & Test in Europe Conference & Exhibition, Apr. 20-24, 2009, 5 pages.

Park et al., "In Situ SRAM Static Stability Estimation in 65-nm CMOS", IEEE Journal of Solid-State Circuits, vol. 48, No. 10, Oct. 2013, pp. 2541-2549.

Chan et al., "Automated Stressing and Testing of Semiconductor Memory Cells", U.S. Appl. No. 15/207,618, filed Jul. 12, 2016.

IBM, List of IBM Patents or Patent Applications Treated as Related, Jul. 11, 2016, 2 pages.

Chan et al., "Automated Stressing and Testing of Semiconductor Memory Cells", U.S. Appl. No. 15/414,667, filed Jan. 25, 2017.

IBM, List of IBM Patents or Patent Applications Treated as Related, Jan. 24, 2017, 2 pages.

* cited by examiner

STRESSING AND TESTING SEMICONDUCTOR MEMORY CELLS

BACKGROUND

The present disclosure generally relates to memory architecture, and more specifically, to testing of memory cells in a semiconductor memory array.

As the design of semiconductor memory arrays advances over time, the number and density of memory cells in a memory array generally increases. As a result, the quality of the memory cells of a memory array may fluctuate. In particular, relatively weak memory cells can change their cell content data during a read operation. Memory array testing may be required to determine and/or monitor the quality of memory cells. In particular, read stability memory cells may be tested and/or monitored to ensure that it is at sufficient during the entire estimated lifetime of the memory array. Traditionally, a supplementary power supply, separate from a supply voltage $V_{DD}$, has been provided for resell testing. However, providing a supplementary power supply can caused increased difficulties in wire routing to the memory array and within a host integrated circuit (IC) in general.

SUMMARY

An improved memory array that allows read stability tests and methods for stressing and testing a memory cell can have certain advantages in increasing the reliability of semiconductor memory arrays.

Embodiments may be directed towards a method for stressing a semiconductor memory cell. The memory cell may be readable through a bit line and addressable through a word line. The method can include addressing, for an addressing time, the memory cell through the word line. The method can also include stressing the memory cell by applying a stress voltage to the bit line for a stress voltage time, the stress voltage time overlapping with the addressing time for a stress time Δt.

Embodiments may also be directed towards a method for testing a semiconductor memory cell. The memory cell may be readable through a bit line and addressable through a word line. The method can include writing a first data value into the memory cell and stressing the memory cell by applying a stress voltage to the bit line for a stress voltage time. The stress voltage time can overlap with the addressing time for a stress time Δt. The method can also include reading a first stored data value from the memory cell and determining whether the first stored data value corresponding to the first data value.

Embodiments may be also directed towards a memory array that includes at least one memory cell. The memory cell can be addressable through a word line and readable through a bit line. The memory array can also include a stress circuit configured to apply a stress voltage to the bit line.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
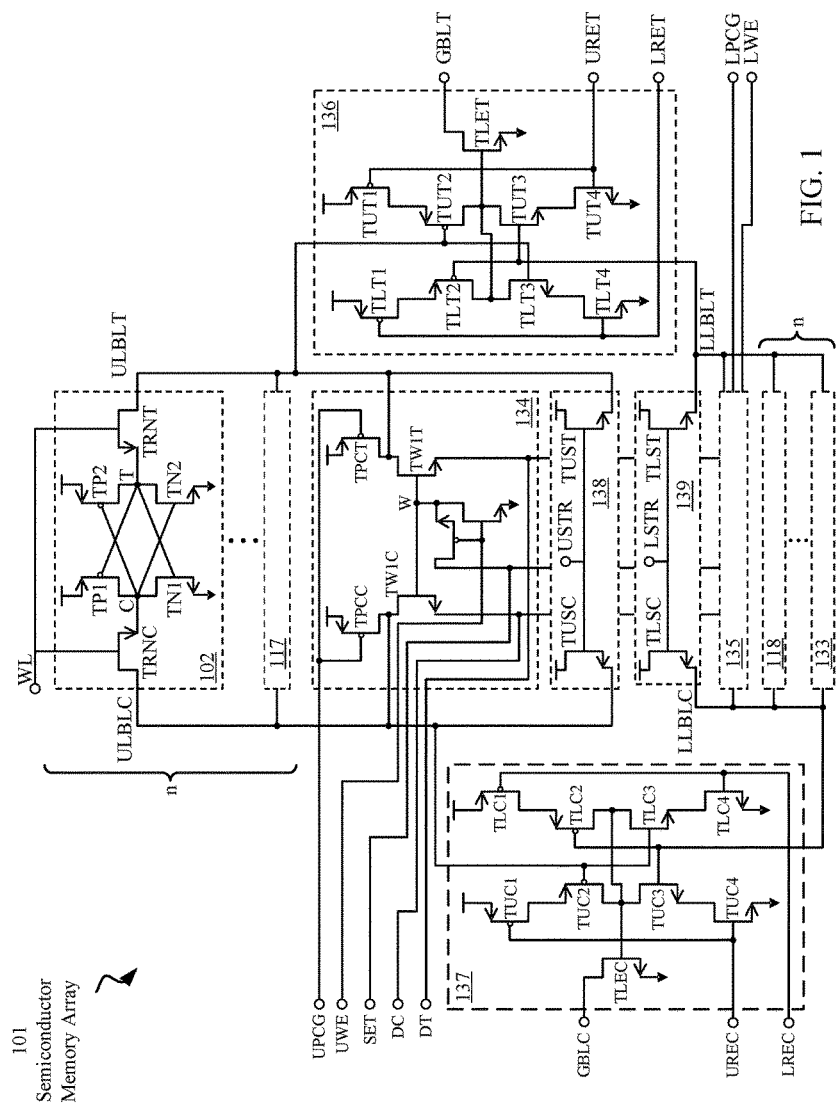
FIG. 1 depicts a semiconductor memory array.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

In the drawings and the Detailed Description, like numbers generally refer to like components, parts, steps, and processes.

DETAILED DESCRIPTION

The present disclosure may be better understood, and its numerous objects, features, and advantages made apparent to those skilled in the art by referencing the accompanying drawings.

FIG. 1 depicts a memory array 101 which allows for testing the read stability of the memory cells 102-117 and 118-133. The memory array 101 includes "n" memory cells 102-117 connected to a common upper local bit line ULBLT and a common complement upper local bit line ULBLC. Moreover, each of the memory cells 102-117 is connected to a respective word line WL for addressing the memory cell 102-117 to be read.

The memory array 101 further includes "n" memory cells 118-133 which are connected to a common lower local bit line LLBLT and to a common complement lower local bit line LLBLC. The memory cells 118-133 are addressable through respective word lines, not shown. In an example embodiment, the number "n" of memory cells 118-133 connected to a common, complement bit line may be sixteen.

Write circuits 134 and 135 may be used to write data or content into the respective memory cells 102-117 and 118-133. The content of the memory cells 102-117 and 118-133 may be evaluated using local evaluation circuits 136 and 137. In addition, stress may be applied to the memory cells 102-117 and 118-133 using stress circuits 138 and 139.

In the embodiment shown in FIG. 1, the memory array 101 is symmetrical with respect to the "true" side and the "complement" side, as well as symmetrical with respect to the upper and lower side. However, in some embodiments, the memory array 101 may also include only one local evaluation circuit 136 or 137 on either the true side or the complement side. Moreover, in some embodiments, the memory array 101 may include only an upper or a lower section. In embodiments, it is possible that only the true or complement side of the memory cells 102-117 and 118-133 may be used for writing content into, and reading the content from, the memory cells 102-117 and 118-133.

The write circuit 134 includes a precharge circuit including the transistors TPCC and TPCT, which are used for precharging the upper local bit line ULBLT and the complement upper local bit line ULBLC, in response to an upper precharge signal UPCG. In the embodiment shown in FIG. 1 the transistors TPCC and TPCT are P-channel field-effect transistors (PFETs).

Two transistors, the N-channel field-effect transistor (NFET) TW1T and the NFET TW1C, are used for writing data received at the data input DT and the complement data input DC into the memory cells 102-117, in response to a signal at the SET input.

The data input DT, the complement data input DC and the SET input are common to both the upper write circuit 134 and the lower write circuit 135. An upper write enable input UWE and a lower write enable input LWE allow for selecting if the data shall be written, in response to the set signal, into the upper memory cells 102-117, or into the lower memory cells 118-133.

The memory cells 102-117 and 118-133 may be read using the bit lines ULBLC, ULBLT, LLBLC and LLBLT. According to embodiments, the memory cell 102 is a static random-access memory (SRAM) memory cell, more specifically a 6-transistor static random-access memory (6T-SRAM) memory cell. The memory cell 102 includes four transistors TP1, TN1, TP2 and TN2 forming a latch and two transistors TRNC and TRNT used for writing and reading the content stored within the latch.

The latch may be in a state having a logical "low" potential at node T causing the transistor TP1 to be conductive and the transistor TN1 to be non-conductive or turned off. Accordingly, the latch has a logical high potential at node C causing the transistor TP2 to be non-conductive and the transistor TN2 to be conductive.

Before reading the content of the memory cell 102, the potential of the local bit lines ULBLC and ULBLT is raised to a logical "high" level. Afterwards, the memory cell 102 the transistors TRNC and TRNT are caused to be conductive in response to a signal on the word line WL.

In the embodiment shown in FIG. 1, the gates of the transistors TRNC and TRNT are connected to a common word line. However, in some embodiments, the transistors TRNC and TRNT, which allow addressing the memory cell 102, may be connected to separate word lines, for example, a regular word line WLT and a complement word line WLC. This connection scheme may allow for testing the reading circuit on both or on only one of the true or complement sides of the memory cell 102.

When transistor TN2 is conductive, the bit line ULBLT is pulled down to a logical low voltage. However, if the transistor TN1 is faster in pulling down node C in response to the logical high voltage of the local bit line ULBLT than transistor TN2 is in pulling down node T, the state of the latch may flip so that a logical high value or potential is present at node C.

Memory cells changing their content or data value during a read operation may be considered as defective, and may need to be avoided. Accordingly, the memory array 101 includes stress circuits 138 and 139 for testing the memory cells 102-117 and 118-133. The stress circuits 138 and 139 include transistors TUST, TUSC and TLST, TLSC, respectively, for providing additional electric charge to the local bit lines ULBLT, ULBLC, LLBLT and LLBLC in response to a stress signal USTR, LSTR applied to the gates of the transistors TUST and TUSC as well as TLST and TLSC, respectively.

In the embodiment shown in FIG. 1, the transistor pairs TUST, TUSC and TLST, TLSC are NFETs. Accordingly, the voltage applied to the local bit lines ULBLT, ULBLC, LLBLT and LLBLC is reduced by the threshold voltage $V_T$ of the transistors TUST, TUSC, TLST and TLSC. Thus, the voltage $V_{DD}$-$V_T$ is applied to the local bit lines ULBLT, ULBLC, LLBLT and LLBLC. This may be referred to as a "weak flood" of the local bit lines ULBLT, ULBLC, LLBLT and LLBLC.

In some embodiments, not shown, the transistor pairs TUST, TUSC and TLST, TLSC may be PFETs. Thus, the stress signal USTR, LSTR applied to the gates of the transistors TUST and TUSC as well as TLST and TLSC, respectively, will be inverted. Moreover, the conductive PFETs will apply the full voltage $V_{DD}$ to the local bit lines ULBLT, ULBLC, LLBLT and LLBLC. This may be referred to as a "strong flood" of the local bit lines ULBLT, ULBLC, LLBLT and LLBLC.

The local bit lines ULBLT and LLBLC may be read using the local evaluation circuit 136. The local evaluation circuit 136 may read only the local bit line ULBLT or only the local bit line LLBLT, or both local bit lines ULBLT and LLBLT, in response to input signals URET and LRET.

The local evaluation circuit 136 includes a pull-down transistor TLET for pulling down the global bit line GBLT to ground in case one of the activated local bit line(s) ULBLT, LLBLT is at ground.

A logical low voltage on the input signal URET activates the local bit line ULBLT. The transistor TUT1 becomes conductive and the transistor TUT4 becomes non-conductive. A logical low voltage on the local bit line ULBLT causes transistor TUT2 to be conductive and transistor TLT3 to be non-conductive. Hence, $V_{DD}$ is applied to the gate of transistor TLET through conductive transistors TUT1 and TUT2. Accordingly, the transistor TLET will pull the global bit line GBLT to ground, irrespective of the voltage of the local bit line LLBLT.

A logical low voltage of the input signal LRET activates the local bit line LLBLT. The transistor TLT1 becomes conductive and the transistor TLT4 becomes non-conductive. A logical low voltage on the local bit line LLBLT causes transistor TLT2 to be conductive and transistor TLT3 to be non-conductive. Hence, $V_{DD}$ is applied to the gate of transistor TLET through conductive transistors TLT1 and TLT2. Accordingly, the transistor TLET will pull the global bit line GBLT to ground, irrespective of the voltage of the local bit line ULBLT. The local evaluation circuit 137 functions in a similar fashion.

In some embodiments of the memory array, the stress circuit can include a stress transistor adapted to apply a stress voltage to the bit line in response to a stress signal. Applying the stress voltage to the bit line may involve a particularly simple hardware implementation, consuming only a small area on the semiconductor substrate. In embodiments, the source of the stress transistor can be connected to $V_{DD}$, and the drain of the stress transistor is connected to the bit line. In some embodiments, the stress transistor can be an NFET, which may allow for a relatively weak stress to be applied to the bit line. In some embodiments the stress transistor can be a PFET, which may allow for a relatively strong stress is to be applied to the bit line. In some embodiments, the gate of the stress transistor is driven by a programmable clock generator, which may be self-resetting.

In some embodiments, the memory cell is a 6-transistor SRAM (6T-SRAM) cell, which can include fin field-effect transistor (FINFET) transistors. In some embodiments of the memory array, the memory cell is an 8-transistor SRAM (8T-SRAM) cell, which can also include FINFET transistors.

Figure 2:
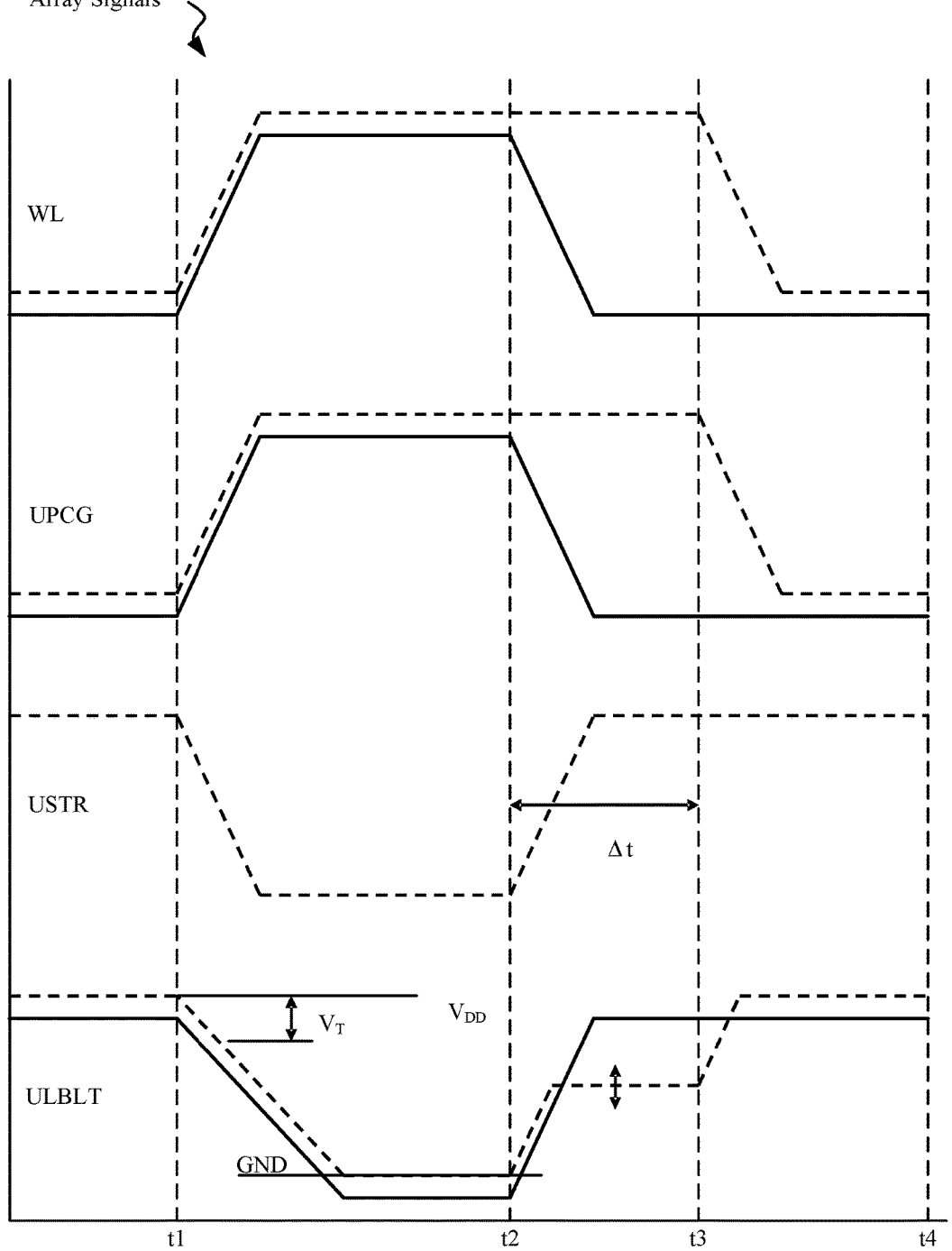
FIG. 2 depicts example semiconductor memory array signals over time used in a method for applying stress to memory cells of a memory array using a pulse stress scheme.

FIG. 2 depicts waveforms and an associated method for applying stress to memory cells of a memory array using a pulse stress scheme. The waveform diagram shows, in simplified form, the voltages of the word line WL, the precharge signal UPCG, the stress signal USTR and the local bit line ULBLT, over time. The continuous, solid lines depict a normal functional read operation and the dashed lines depict a pulse stress functional read operation.

First, the normal functional read operation is described. At time t1, a rising precharging signal UPCG completes precharging the local bit line ULBL by causing the transistors TPCT to become non-conductive. During normal functional reading, the stress signal USTR remains at a logical low voltage. Accordingly, no additional electrical charge is provided to the local bit line ULBLT. Immediately after the precharging signal reaches a logical high level, the memory cells 102-117 are addressed by raising the word line WL to a logical high voltage, which causes transistor TRNT to become conductive. If at least one of the memory cells 102-117 (FIG. 1) has a logical low voltage at node T, the local bit line ULBLT will slowly be discharged and assume a logical low voltage again.

At time t2, a falling edge of the word line WL completes the reading the memory cells 102-117. The precharge signal UPCG is raised again to a logical high voltage, which pulls up the local bit line ULBLT to the voltage $V_{DD}$ again. The transistor TPCT used for charging the local bit line ULBLT may allow for conducting more current than the transistor TRNT of the memory cells 102-117. Accordingly, the rising edge of the local bit line ULBLT can be steeper than the falling edge.

If a pulse stress scheme is applied to the memory cells 102-117 (FIG. 1), the stress signal USTR is pulled to a logical low voltage at approximately the same time t1, when the precharge signal UPCG is raised to a logical high voltage. Thereafter, the word line WL is raised to a logical high voltage and the local bit line ULBLT is discharged.

In contrast to a normal functional read operation, the word line WL remains at a logical high voltage and the precharge signal remains logical low until time t3. However, at time t2, the stress signal USTR is raised to a logical high voltage and the transistor TUST tries to pull the local bit line ULBLT to a logical high voltage, i.e. $V_{DD}$-$V_T$, against the discharging transistor TRNT of the memory cells 102-117. Hence, a "weak flood" of electrical charge is provided to the local bit line ULBLT. Accordingly, the local bit line ULBLT will assume a potential between ground and ($V_{DD}$-$V_T$). During this stress phase weak memory cells 102-117 will "flip" or invert their content. Strong memory cells 102-117 (FIG. 1) will retain their content.

At time t3, a falling edge of the word line WL completes reading the memory cells 102-117 (FIG. 1) again. Accordingly, the precharge signal UPCG is raised again to a logical high voltage, which pulls up the local bit line ULBLT to the supply voltage $V_{DD}$. The period $\Delta t$=t3–t2 between time t2 and t3 may be adjusted according to various levels of stress resistances of the memory cells 102-117 (FIG. 1) to be tested.

In some embodiments, the transistor TUST may be a PFET and the stress signal USTR inverted, i.e. at a logical high voltage, when no stress is applied, and at a low-high-low voltage, when stress is applied. Accordingly, the transistor TUST will try to pull the local bit line ULBLT to the full logical high voltage $V_{DD}$, i.e. a strong flood of electrical charge is provided to the local bit line ULBLT, between time t2 and t3. In the pulse stress scheme, the first portion of the cycle may be used for normal functional read operation and the second portion of the cycle may be used for the stress application. The result of the stress application may be determined during the functional read operation in the next cycle.

The pulse stress scheme provides a relatively mild stress the memory cells 102-117 (FIG. 1), because causing the transistor TUST to be conductive at the end of the functional read operation, i.e. when the local bit line ULBLT is at logical low voltage, will pull up the local bit line ULBLT at a relatively low slew rate.

In some embodiments of the above-described method, more than one memory cell may be stressed and/or interconnected. In a particular example, 16 memory cells may be connected to the same bit line. By addressing several interconnected memory cells, the stress voltage may be applied to all the addressed memory cells simultaneously, and the resulting time for testing a memory array with a large amount of memory cells may be reduced.

In some embodiments, each memory cell is readable through bit line and a complement bit line and that the memory cell is stressed by applying a stress voltage to both bit lines for a stress voltage time that overlaps with the addressing time for a stress time $\Delta t$.

In some embodiments, each memory cell is addressable, i.e. connectable to the bit line, through a separate word line on the true side of the memory cell and on a complement word line on the complement side of the memory cell. Thus, asymmetric stress can be applied to the memory cell by applying a stress voltage to only a single side of the memory cell.

In some embodiments, stressing is performed at the end of the addressing time. If the stress is applied at the end of the addressing time, the timing for addressing the memory cells during stressing and during normal functional reading may remain essentially the same. In particular, the synchronization with the global clock signal may be left unaltered.

In some embodiments, the stress voltage time can overlap the end of the addressing time interval. This scheme may be used to avoid having rising or falling edges of control signals used for applying the stress voltage and addressing the memory cells coinciding with one another, which may lead to indeterminate behavior of the memory cells and of the memory array.

In some embodiments, the stress time $\Delta t$ can be shorter than the addressing time. Accordingly, the memory cell may already have pulled down the bit line a certain amount before the stress voltage is applied to the local bit line. Therefore, a milder stress may be applied to the memory cell.

In some embodiments, the difference between the addressing time and the stress time $\Delta t$ is larger than the time required for discharging the bit line through the memory cell. This scheme may allow for a normal functional reading of the content of the memory cell before stress is applied to the memory cell.

In some embodiments, the stress voltage is equal to $V_{DD}$. Applying a stress voltage of $V_{DD}$ may be considered as a "strong" stress. Hence, only very robust memory cells will resist "flipping" or inverting the data value stored within the cell. This may ensure that only very robust memory cells will pass the testing.

According to embodiments of the method for stressing a memory cell, the stress voltage is $V_{DD}$-$V_T$. Applying a stress voltage of $V_{DD}$-$V_T$, i.e. a voltage of $V_{DD}$ reduced by the threshold voltage $V_T$ of an NFET transistor, may be considered as a "weak" stress. Thus, more memory cells may pass such testing. This type of testing may enhance the yield of the tested memory cells, while providing a sufficient safety margin for end-of-life degradation.

Figure 3:
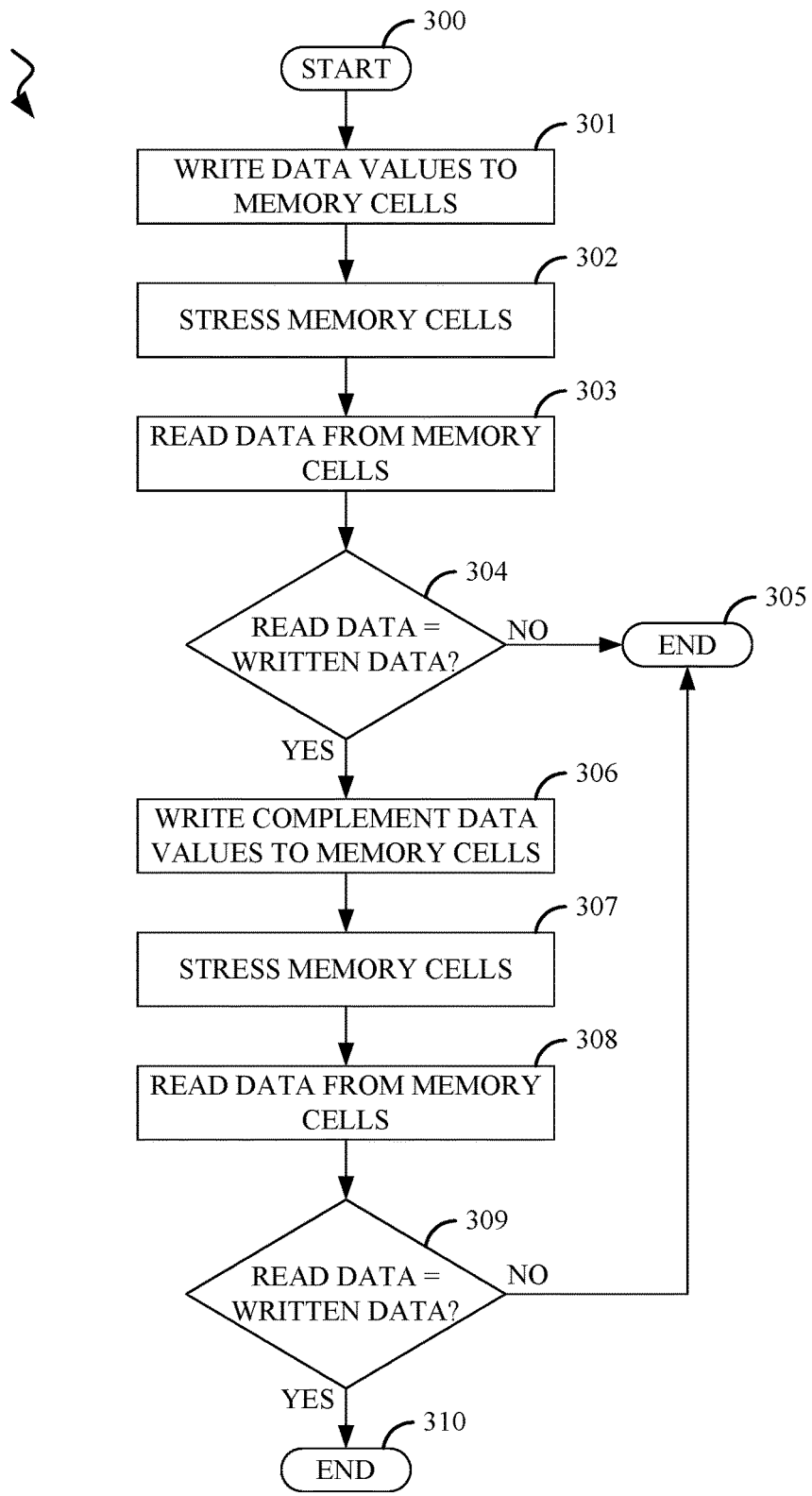
FIG. 3 is a flow diagram illustrating a method for testing memory cells of a memory array.

FIG. 3 illustrates a method for testing memory cells of a memory array. The process moves from start 300 to operation 301. In operation 301, the same defined data value is written to all memory cells 102-117 and 118-133 (FIG. 1), to be tested. For example, the memory cells 102-117 and 118-133 (FIG. 1) may be written to have a logical "low" voltage at node T.

In a second operation 302, a stress voltage is applied to the memory cells 102-117 and 118-113 (FIG. 1) according to a pulse stress scheme and/or a full stress scheme described above. Then, in operation 303, a functional read operation is performed on the memory cells 102-117 and 118-133 (FIG. 1). In operation 304 it is determined if the result of the functional read operation corresponds to the logical data value represented by the voltage, which has been written to node T. If the values are different, a weak memory cell has been found and testing may stop in operation 305. If the values correspond to each other, the complement or inverted value is written to all memory cells 102-117 and 118-133 (FIG. 1) in operation 306. For example, if in operation 301, the memory cells 102-117 and 118-133 (FIG. 1) have been written to have a logical low voltage at node T, the memory cells 102-117 and 118-133 (FIG. 1) are written to have a logical high voltage at node T. The same stress is applied to the memory cells 102-117 and 118-133 (FIG. 1) in operation 307 as in operation 303. In operation 308, all memory cells 102-117 and 118-133 (FIG. 1) are read again. In operation 309, the read value is compared with the inverted value written in operation 306. If the values are different, a weak memory cell has been found and testing stops at operation 305. If the values are the same, it is determined that all memory cells are good and the method stops at operation 310.

In some embodiments of the above-described method, testing a memory cell can include writing a second, predetermined, data value into the memory cell, wherein the second data value corresponds to the inverted first predetermined data value. The method can also include stressing the memory cell, reading the stored value from the memory cell, and determining whether the stored value corresponds to the second data value. By stressing the memory cell for read stability for both possible states of the memory cell, due account may be taken for the symmetry of the memory cell. According to some embodiments of the method for testing a memory cell, stressing the memory cell and reading the memory cell are performed within one global clock cycle.

Figure 4:
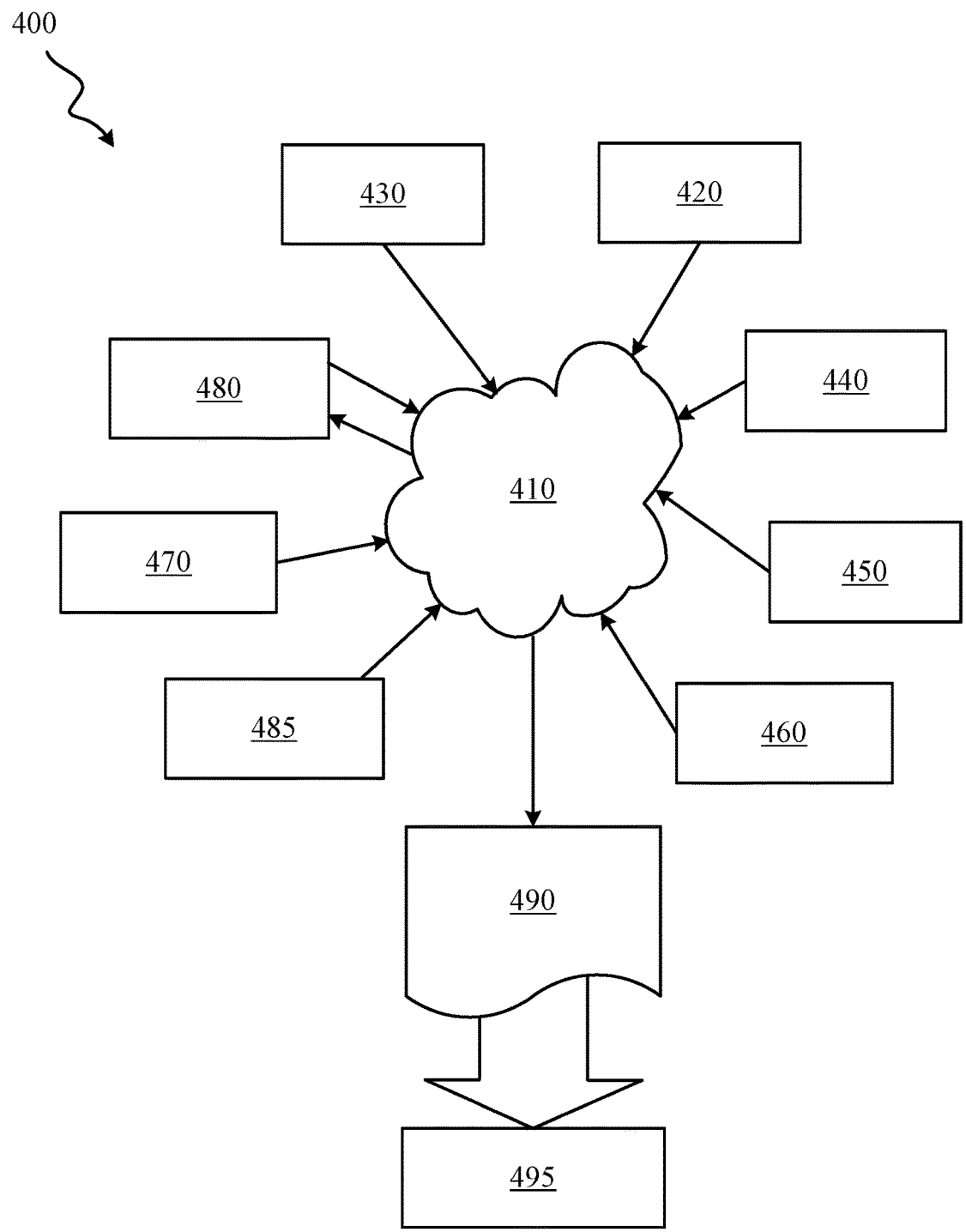
FIG. 4 is a diagram depicting a design process used in semiconductor design, manufacture, and/or test of the inventive memory array depicted in, according to embodiments of the disclosure.

FIG. 4 illustrates multiple design structures 400 including an input design structure 420 that is preferably processed by a design process. Design structure 420 may be a logical simulation design structure generated and processed by design process 410 to produce a logically equivalent functional representation of a hardware device. Design structure 420 may alternatively include data or program instructions that, when processed by design process 410, generate a functional representation of the physical structure of a hardware device. Whether representing functional or structural design features, design structure 420 may be generated using electronic computer-aided design, such as that implemented by a core developer/designer. When encoded on a machine-readable data transmission, gate array, or storage medium, design structure 420 may be accessed and processed by at least one hardware or software modules within design process 410 to simulate or otherwise functionally represent an electronic component, circuit, electronic or logic module, apparatus, device, or system such as those shown in FIG. 1 or a circuit configured for carrying out the methods described in reference to FIG. 2 and FIG. 3. As such, design structure 420 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 410 preferably employs and incorporates hardware or software modules for synthesizing, translating, or otherwise processing a design/simulation functional equivalent of the components, circuits, devices, or logic structures shown in FIG. 1 or a circuit configured for carrying out the methods described in reference to FIG. 2 and FIG. 3, to generate a Netlist 480 which may contain design structures such as design structure 420. Netlist 480 may comprise, for example, compiled or otherwise processed data structures representing a list of wires, discrete components, logic gates, control circuits, I/O devices, models, etc. that describe the connections to other elements and circuits in an integrated circuit design. Netlist 480 may be synthesized using an iterative process in which Netlist 480 is resynthesized at least one times depending on design specifications and parameters for the device. As with other design structure types described herein, Netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 410 may include hardware and software modules for processing a variety of input data structure types including Netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410, without deviating from the scope and spirit of the disclosure. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures, along with any additional mechanical design or data, to generate a second design structure 490. Design structure 490 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 420, design structure 490 preferably comprises at least one files, data structures, or other computer-encoded data or instructions that reside on transmission or data storage media and that, when processed by an ECAD system, generate a logically or otherwise functionally equivalent form of at least one of the embodiments of the disclosure shown in FIG. 1 or a circuit configured for carrying out the methods described in reference to FIG. 2 and FIG. 3. In one embodiment, design structure 490 may comprise a compiled, executable HDL simulation model that functionally simulates the devices shown in FIG. 1 or a circuit configured for carrying out the methods described in reference to FIG. 2 and FIG. 3.

Design structure 490 may also employ a data format used for the exchange of layout data of integrated circuits and/or symbolic data format (e.g., information stored in a GDSII, GL1, OASIS, map files, or any other suitable format for storing such design data structures). Design structure 490 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1 or a circuit configured for carrying out the methods described in reference to FIG. 2 and FIG. 3. Design structure 490 may then proceed to a state 495 where, for example, design structure 490 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for stressing a semiconductor memory cell, the memory cell being readable through a bit line and addressable through a word line, the method comprising:
   addressing, for an addressing time, the memory cell through the word line; and
   stressing the memory cell by applying a stress voltage to the bit line for a stress voltage time, the stress voltage time overlapping with the addressing time for a stress time $\Delta t$.

2. The method of claim 1, wherein the stressing is performed at an end of the addressing time.

3. The method of claim 1, wherein the stress voltage time overlaps an end of the addressing time.

4. The method of claim 1, wherein the stress time $\Delta t$ is less than the addressing time.

5. The method of claim 4, wherein a difference between the addressing time and the stress time $\Delta t$ is greater than a time required for discharging the bit line through the memory cell.

6. The method of claim 1, wherein the stress voltage is equal to the supply voltage $V_{DD}$.

7. The method of claim 1, wherein the stress voltage is a supply voltage $V_{DD}$ minus a threshold voltage $V_T$.

8. A method for testing a semiconductor memory cell, the memory cell being readable through a bit line and addressable through a word line, the method comprising:
   writing a first data value into the memory cell;
   stressing the memory cell by applying a stress voltage to the bit line for a stress voltage time, the stress voltage time overlapping with the addressing time for a stress time $\Delta t$;
   reading a first stored data value from the memory cell; and
   determining whether the first stored data value corresponds to the first data value.

9. The method of claim 8, further comprising:
   writing a second data value into the memory cell, wherein the second data value corresponds to the complement of the first data value;
   stressing the memory cell by applying the stress voltage to the bit line for the stress voltage time, the stress voltage time overlapping with the addressing time for the stress time $\Delta t$;
   reading a second stored value from the memory cell; and
   determining whether the second stored value corresponds to the second data value.

10. The method of claim 8, wherein the stressing of the memory cell and the reading the first stored data value from the memory cell are performed within one global clock cycle.

11. A memory array including at least one memory cell, the memory cell being addressable through a word line and readable through a bit line, the memory array further including a stress circuit configured to apply a stress voltage to the bit line, the stress circuit including a stress transistor configured to, in response to a stress signal, apply the stress voltage to the bit line, a source terminal of the stress transistor connected to a supply voltage $V_{DD}$, a drain terminal of the stress transistor connected to the bit line, and a gate terminal of the stress transistor driven by a programmable clock generator.

12. The memory array of claim 11, wherein the stress transistor is an N-channel field-effect transistor (NFET).

13. The memory array of claim 11, wherein the stress transistor is a P-channel field-effect transistor (PFET).

14. The memory array of claim 11, wherein the programmable clock generator is a self-resetting clock generator.

15. The memory array of claim 11, wherein the memory cell is a 6-transistor static random-access memory (6T-SRAM) cell.

16. The memory array of claim 15, wherein the 6T-SRAM cell includes a fin field-effect transistor (FINFET) transistor.

17. The memory array of claim 11, wherein the memory cell is an 8-transistor static random-access memory (8T-SRAM) cell.

* * * * *